United States Patent [19]
Yu et al.

[11] Patent Number: 5,722,579
[45] Date of Patent: Mar. 3, 1998

[54] BOTTOM-SURFACE-METALLURGY REWORK PROCESS IN CERAMIC MODULES

[75] Inventors: Roy Yu, Wappingers Falls; James Patrick Wood, Beacon; Thomas Michael Biruk, Staatsburg; Gregory Scott Boettcher, Hopewell Junction; William Harrington Brearley; Kimberley Ann Kelly, both of Poughkeepsie; Bouwe William Leenstra, Walden; Arthur Gilman Merryman, Hopewell Junction, all of N.Y.

[73] Assignee: International Business Machines Corporation, Armonk, N.Y.

[21] Appl. No.: 638,415

[22] Filed: Apr. 26, 1996

[51] Int. Cl.[6] ............ B23K 1/018; B23K 31/02
[52] U.S. Cl. ............ 228/119; 228/264; 228/19
[58] Field of Search ............ 228/119, 191, 228/264, 19

[56] References Cited

U.S. PATENT DOCUMENTS

| | | | |
|---|---|---|---|
| 4,327,472 | 5/1982 | Krzeptowski | 228/264 |
| 4,632,294 | 12/1986 | Drunchel et al. | 228/119 |
| 4,894,910 | 1/1990 | Reimer et al. | 29/764 |
| 5,192,843 | 3/1993 | Cargnel et al. | 219/56.22 |
| 5,284,286 | 2/1994 | Brofman et al. | 228/19 |

FOREIGN PATENT DOCUMENTS 61-150258 of 1986 Japan.

OTHER PUBLICATIONS

R.H. Cadwallader and H.R. Poweleit, "Substrate Tin Repair," *IBM Tech. Discl. Bull.*, vol. 18, No. 10, Mar. 1976, pp. 3273–3274.

"Hot–Gas Pin Repair with Pin–Side Bias," *IBM Tech. Discl. Bull.*, vol. 31, No. 9, Feb. 1989, pp. 342–345.

"Pin Attach Tool," *Research Disclosure*, Kenneth Mason Publications, Ltd., England, March 1990, No. 311.

"Pin Repair of MLC Substrate I/O Pads by Focused Ion Beam" Published Anonymously, Research Disclosure, No. 335, Kenneth Mason Pub. Ltd., England, March 1992.

*Primary Examiner*—P. Austin Bradley
*Assistant Examiner*—Jeffrey T. Knapp
*Attorney, Agent, or Firm*—H. Daniel Schnurmann

[57] ABSTRACT

Multi-chip modules provided with a pin array may, under close scrutiny, display certain defects that may cause reliability problems. The presence of even one such defect necessitates the scrapping of the module. A method of salvaging the module is described, wherein the module is reworked by the method comprising the steps of applying a shearing force against the pins. During which the module is exposed to a temperature at or above that which is necessary for softening the braze material to remove the pins; polishing the surface of the module including the pads; evaporating the new pads; and attaching new pins to the pads.

22 Claims, 4 Drawing Sheets

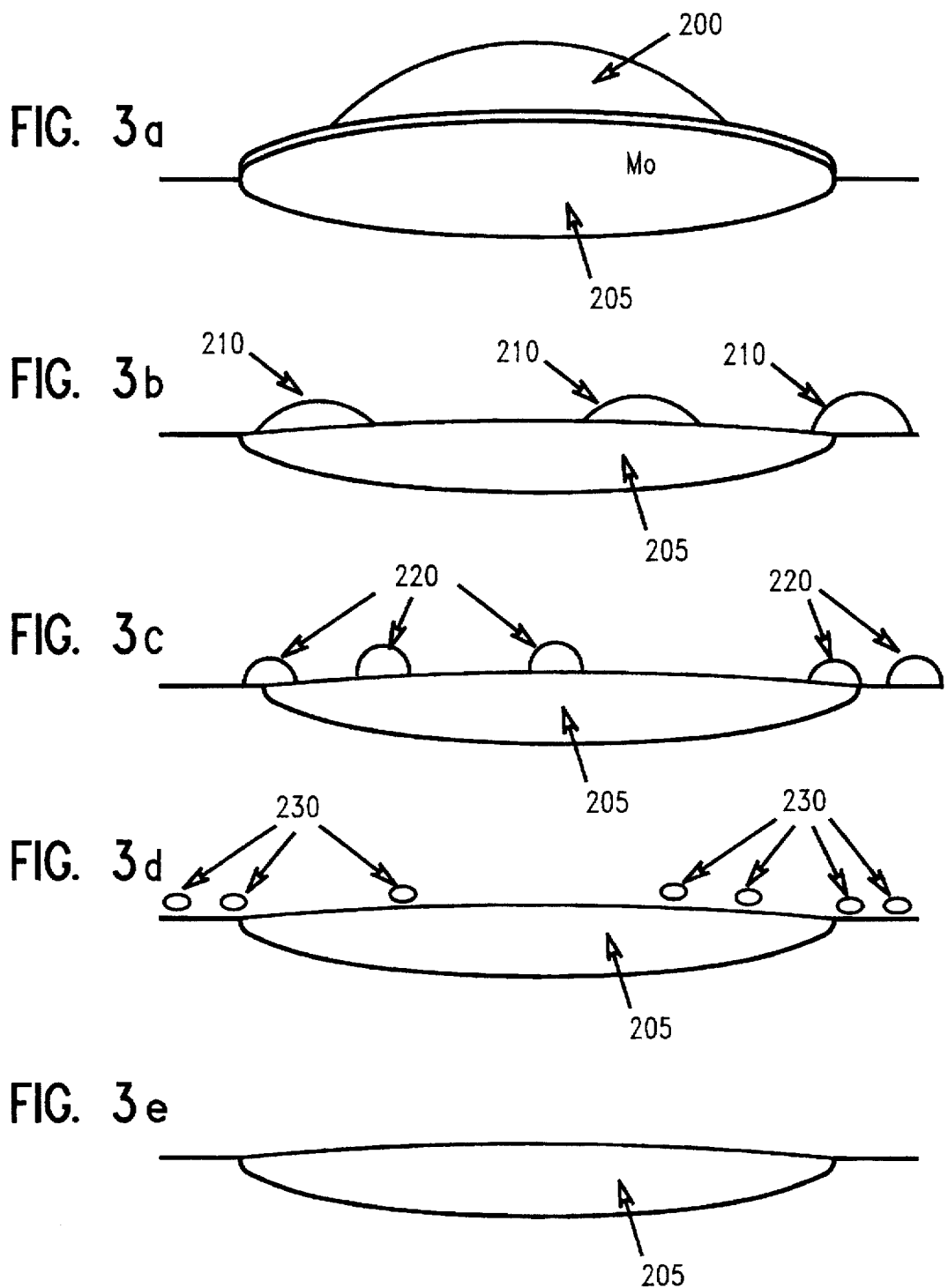

BOTTOM-SURFACE-METALLURGY REWORK PROCESS IN CERAMIC MODULES

FIELD OF THE INVENTION

This invention relates generally to integrated circuit chip carrier multi-layer substrates for computer applications, and more particularly, to a rework process for removing module pins with their corresponding Bottom-Surface-Metallurgy (BSM) pads by applying a shearing force under appropriate thermal conditions; for forming new pads and affixing new pins after mechanically polishing the surface of the substrate.

BACKGROUND OF THE INVENTION

Multi-layer ceramic (MLC), glass and glass-ceramic multi-chip substrates have been widely used in the computer industry as chip carriers, wherein semiconductor integrated circuit chips, hereinafter referred to as IC's, are attached to the substrate. These modules are subsequently mounted and secured to a card by a plurality of module pins. Typically, a high end package may contain as many as 1000–3000 pins.

Module pins, are commonly connected to the substrate via a BSM pad. It suffices to detect a single defective pin or a damaged BSM pad at final inspection to scrap the entire module. As such, repairability of a substrate is of prime importance to salvage defective parts, to improve yields and to lower the cost of manufacturing.

Several techniques have been described for repairing multi-chip substrates. In U.S. Pat. No. 5,284,286 to Brofman et al., and of common assignee, solder or braze is selectively removed from the defective connecting pad without disturbing immediately adjacent areas where fragile connection pads, such as wire bond, staple bonds, decals, and the like, may be present. Brofman et al. describe a process wherein a porous metal block selectively removes the solder from the substrate and prepares the site for replacement of the removed or broken element.

As the previous reference indicates, for modules without thin-films, most of today's techniques concentrate on repairing damage at a local level as, for instance, in U.S. Pat. No. 5,192,843 to Cargnel et al., who describe a method of replacing a damaged pin in a IC module without damaging the circuit device or the chips mounted on the circuiterized substrate.

In yet another example, in an article published in the issue of Research Disclosure of Mar. 1992, No. 335, published by Kenneth Mason publications, Ltd., England, S. J. Kirch and D. W. Kruger describe a method of repairing damaged I/O pads using a focused ion-beam to locally deposit a new pad or a portion thereof. This technique is followed by brazing the pin(s) on the rejuvenated pad(s), to return the substrate to working order.

Several other techniques of repairing individual pins have been advanced over the years for modules without thin-film, and which apply to dense or sparse electronic packaging structures. Correspondingly, specialized tools to facilitate the removal of defective pins have been disclosed and implemented.

Examples of other rework techniques at a localized level can be additionally found, for instance, in U.S. Pat. No. 4,632,294 to Druschel et al. and of common assignee; in U.S. Pat. No. 4,894,910, to Reimer et al.; and in Japan Patent No. 61-150258 to Uiriamu OO Doratsushieru and of common assignee.

From the aforementioned references, it becomes evident that in the absence of thin-films, the art has gravitated toward repairing individual defective pins on a populated substrate (oftentimes referred to as braze fails). The accepted method is to immerse the module in an environment of hot gas and selectively remove the defective pins, which are subsequently replaced by new ones. This solution is, however, inadequate for modules having thin-films since pins fail on account of reasons others than a braze fail, and wherein a module may not be put back in good working order by simply replacing the defective pin with a new one having a new braze.

Practitioners of the art will fully appreciate that thin-film requires extensive process cycles, (lasting sometimes, 30–50 days), in which a module is subjected to many chemicals and undergoes many varying temperature cycles. These cycles eventually fatigue the BSM pads (which, typically, include several metal layers of, respectively, Mo, Ni and AuSn). Likewise, constant exposure to chemicals brings along an unwanted level of corrosion. This combination can potentially introduce failures at the Mo-ceramic level, at the Ni-Mo interface, and at the Au-Ni level. Corrosion at the BSM pads manifests itself in a high reactivity of the Ni to the braze, that ultimately leads to a premature failure of the pin during chip join reflow. Once there is an indication of poor metallurgy, oftentimes in the form of poor pads or in the formation of voids in the fillets somewhere in the BSM, the module becomes suspect and raises questions about its ability to remain in good working order at time of inspection. Thus, the present invention focuses on problems which are caused when the defect does not reside on the pin itself, but by potential failures in the BSM pad lying directly underneath the pin, and which introduce reliability concerns. It is evident from the previous discussion that prior art remedies normally fail to provide an adequate solution to the problem.

Other types of defects are known to exist that routinely prompt scrapping of the modules. Some are caused by a non-uniform shrinkage of the substrate, particularly, if the substrate is made of ceramic, that leads to a mismatch between the locations of the BSM pads and the position of the pin. Pins brazed under such a mismatch condition will suffer from "centrality" problems that ultimately may cause ceramic tear-out, known as CTO failures.

Defects of particular interest to the present invention include both, "pre-braze" defects (e.g., poor pads which could lead to voids in the fillets) and "post-braze" defects (e.g., poor centrality which, potentially, can cause CTO failures). Either of the two categories cannot be locally cured by just removing an offending pin.

Shown in FIG. 1a, is a pin grid array 10 attached to an IC assembly or module 30, typically made of ceramic. The grid array 10 commonly comprises pins in the order of 1000 to 3000, tightly close together. The surface of the module opposing the side which holds the pin array is provided with a plurality of thin-film layers 40, commonly referred to as the top-side metallurgy (TSM). These thin-film layers are used for redistribution and rewiring purposes. These layers provide additional personalization and, more importantly, a medium for dispensing electrical contact between connecting lines from the various layers of the substrate and the module pins. Chips 60 are normally connected to the substrate TSM through solder balls 50 (also referred to as C-4s). Since chips generate a substantial amount of heat, a heat sink 70 provided with cooling fins 80 is mounted on the back side of the chips for heat removal. Referring now to the bottom side of the module 30, pins are attached to the ceramic substrate by BSM pads 20, which are electrolessly plated with Ni-Au on Mo that 10 was previously deposited at precise locations where vias are to exit the bottom surface of the substrate.

FIG. 1b shows an exploded view of a pin assembly and, more particularly, the various components forming the pin structure.

Referring now more particularly to a typical BSM metallurgy, a via 45, preferably made of sintered Mo paste, contacting an interconnection inside the module is brought out to the bottom (outer) surface of the module for attachment to a pin. The BSM metallurgy generally includes the following elements: a layer of screened-on Mo forms the base of the pin pad and ensures adequate contact of the sintered via to the pin to be built. Pads, preferably made of Ni or a layered metal structure, such as Cr—Ni—Au, are electrolessly plated on top of the Mo pads to form a metallurgy adequate to receive the pin and the braze. The pin is then affixed to the base by braze or solder material, preferably, AuSn, and of sufficient thickness to resist shearing forces. Pins normally have a pin head 25 on which braze, in the form of fillet 15, holds the pin in an upright position. Above the pin head 25 is a pin shank 35 which provides a connection to the card socket or the next level of packaging. As previously mentioned, the BSM, typically including Mo—Ni—Au, is normally considered reliable for modules without thin-film. Since voids in the braze filets are almost exclusively the only reason for failing, the aforementioned method of removing the offensive pin and replacing it with a new one usually suffices to solve the problem.

Due to the unique characteristics of modules with thin-film metallurgy, techniques which are generally acceptable for modules devoid of thin-film, are not easily transportable to modules of the former type. Indeed, the presence of thin-film layers in a module introduces certain type of failures associated with BSM metallurgy of a different kind, e.g., peeling or missing Au, Ni—Au, or Mo. These defects can only be handled by removing the BSM metallurgy prior to reconstructing the module. One of the most sensitive steps includes polishing which is required to remove defective pins and to obtain a smooth surface finish. As such, lap/polish is commonly used to remove metal/ceramic from the surface of the module. However, when a module is subjected to lap/polish, it requires that it be followed by ultra-sonic cleaning. This step causes damage to the thin-film structure by making the thin-film peel away from the ceramic. Moreover, lap/polish requires the use of certain chemicals which in combination with excessive mechanical forces make it unsuited for modules with thin-films.

Another commonly used technique that can potentially be damaging to a module having thin-film metallurgy is the use of bead/sand blasting, wherein the BSM is blasted with an air jet containing sand and/or small glass beads that normally knocks-out the BSM material. This technique has proven to be valuable for removing braze and Ni—Mo placed on the surface of the BSM. Yet, deep inside the structure, particularly, at the Mo to the ceramic interface, peeling was found to occur. In addition, sand/bead blasting was also found unable to reach and remove defects deep down the Mo-ceramic interface.

Thus, it becomes evident from the aforementioned discussion, that techniques which are commonly used, whether mechanical, chemical or a combination thereof fail, and a new approach had to be developed to solve the reliability problems described above.

OBJECTS OF THE INVENTION

Accordingly, it is an object of the present invention to provide a method of reworking a defective substrate to improve yields and avoid unnecessary scrapping.

It is another object of the present invention to repair the substrate by removing reliably and effectively all the brazed pins from the substrate, wherein a defective pad has been found.

It is a further object of the present invention to thermally remove the pins to avoid mechanical damage (e.g., CTO) to the substrate.

It is yet another object of the present invention to polish the substrate after thermally removing the pins, to remove braze material and the Ni—Au pads down to the Mo level.

It is still another object of the present invention to rework the substrate by incorporating a new set of BSM pads with Cr—Ni—Au evaporated on the polished Mo surface upon which pins are to be affixed.

It is a more particular object of the present invention to use an appropriate device, such as a "mouse trap" shaped or a mask, to effectively capture the pins and to urge them away from the module.

SUMMARY OF THE INVENTION

Multi-chip modules provided with a pin array may, under close scrutiny display certain defects, such as voids, on the pad supporting a pin or off-centered pins, that is the cause of many reliability problems. The presence of even one such defect necessitates the scrapping of such modules.

The method, in accordance with the invention, successfully addresses and solves the problem by removing the pin array in its entirety and reworking the module to a reliable state.

Accordingly, there is provided a method for reworking a defective multi-chip module or substrate provided with a pin array, the pins being attached to pads by a braze material, the pads being positioned on a surface of the module or substrate, the method comprising the steps of applying a shearing force against the pins, with the module exposed to a temperature at or above that which is necessary for softening the braze material to remove the pins; polishing the surface of the module including the pads; evaporating the new pads; and attaching new pins to the pads.

BRIEF DESCRIPTION OF THE DRAWINGS

The foregoing and other objects, aspects and advantages of the invention will be more fully understood in conjunction with the following detailed description of the invention and in the attached drawings in which like numerals refer to like structural components, and in which:

FIGS. 3a–3e show the sequence of various steps used for polishing a surface leading to the reconstruction of the pin assembly on top of the polished substrate, according to the present invention.

DETAILED DESCRIPTION OF THE INVENTION

The step of removing the module pins from the surface of the substrate will now be described with reference to FIGS. 2a–2d.

In order to forestall any reliability concerns, as a first step, all the weakened BSM metallurgy, e.g., Ni, Au, braze, pins, need to be removed and replaced. Additionally, if weakness in the Mo-ceramic interface is detected, the weakened structure also requires to be identified and removed. Since there is no indication distinguishing a good pad from a bad one, all BSM pins and pads are globally removed and replaced. The underlying requirement for such pin removal is that the process be conducted under the same conditions which are applicable to pin brazing, to guarantee the integrity of the thin film structure already built on the TSM. This requirement also benefits the manufacturing process. Experience has shown that the pins must be thermally removed, since the use of a mechanical polish furthers the damage the Mo-ceramic interface (ceramic tear-out) due to excessive vibration occurring during polishing.

Figure 1A:
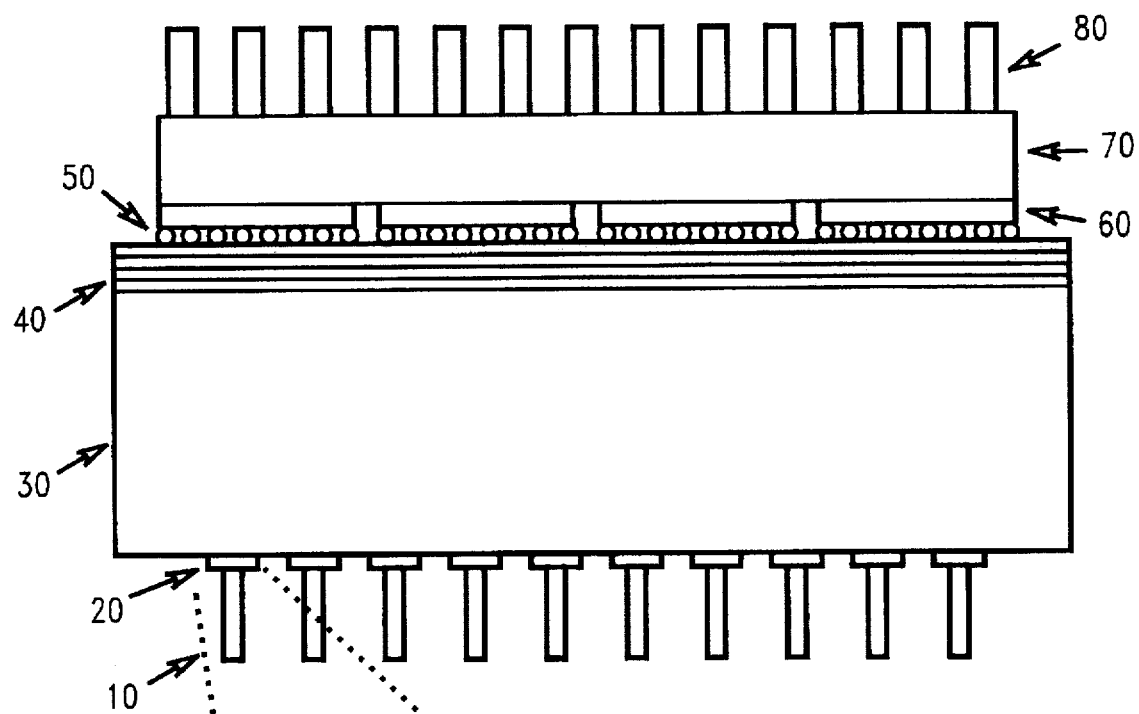
FIG. 1a is a view of a prior art pin array mounted on an multi-layer ceramic substrate.
Figure 1B:
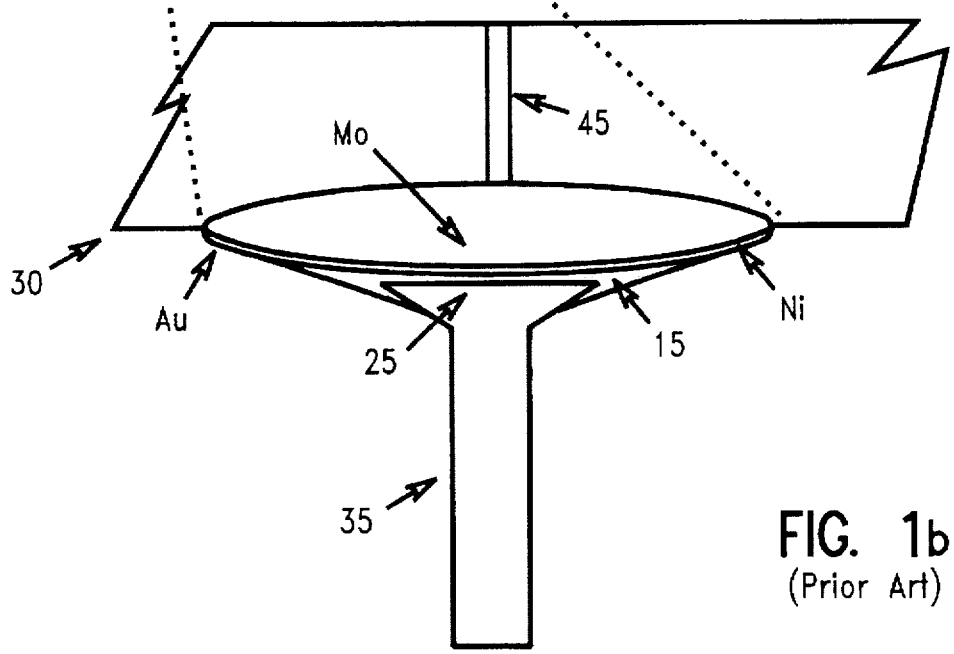
FIG. 1b is a schematic diagram of an exploded view of a prior art BSM pin assembly.
Figure 2A:
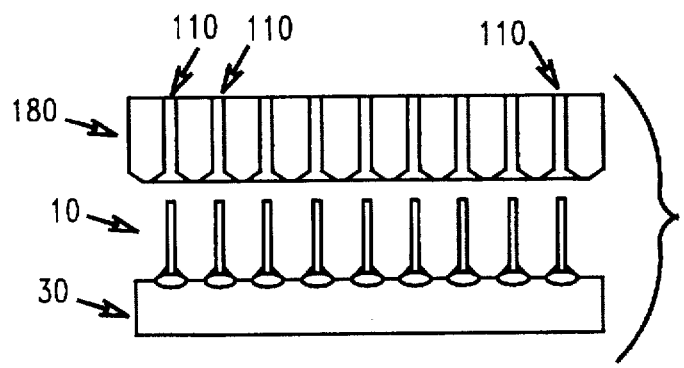
FIGS. 2a–2d are schematic diagrams of an apparatus for detaching the pins from the substrate, in accordance with the present invention.
Figure 2B:
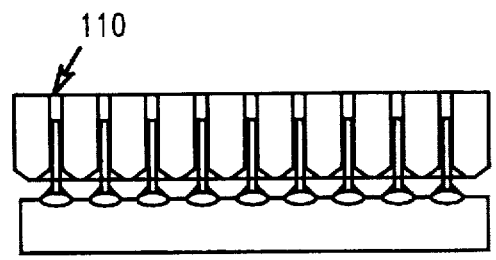

Referring now to FIG. 2a, a device in the shape of a plate 180 (hereinafter referred to as a pin holder) and having a plurality of holes 110 is provided, with a pin grid mask that precisely matches the position of the pins 10. This device will hereinafter be referred to as the mouse-trap for its resemblance to a like device. Each module pin 10, attached to the surface of the module 30, is held in place by the BSM and capped by a corresponding mask hole 110. In FIG. 2b, pins 10 are shown inserted in the holes populating the pin holder.

Figure 2C:
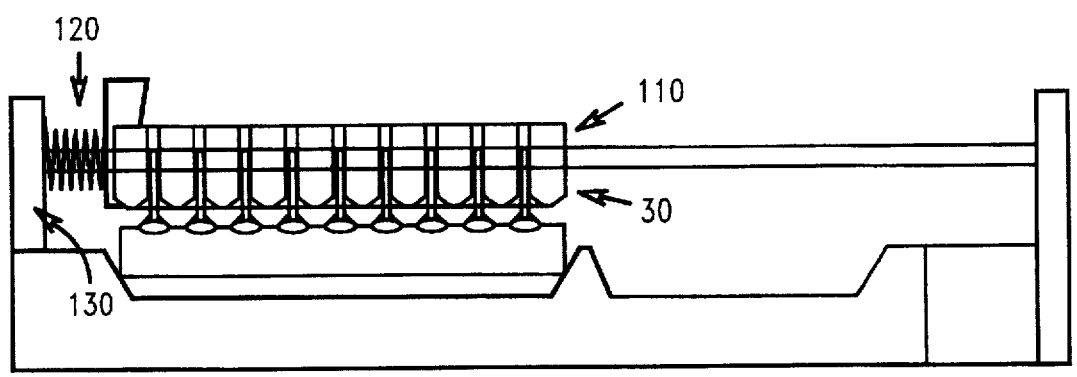
Figure 2D:
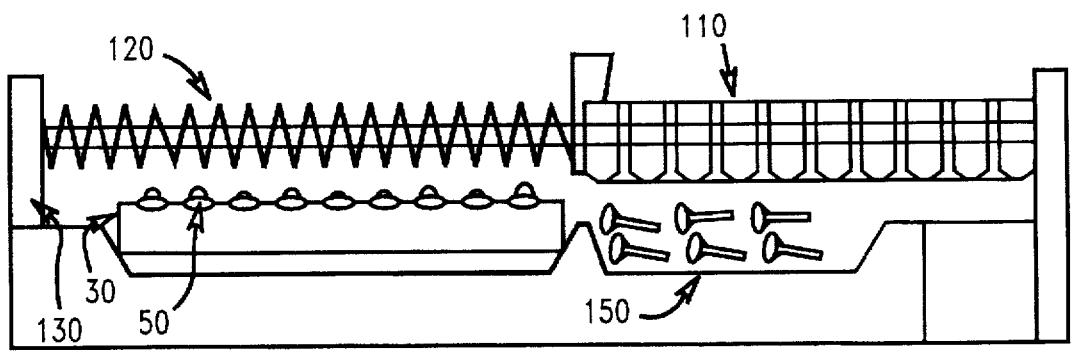

Referring now to FIG. 2c, a spring 120 attached to the pin holder, provides a shearing force on the pins. For a module with 1,000 pins, the spring force is of the order of 5 lb. Spring 120 is preferably rail-guided to maintain a flat movement of the pin holder. The pin holder with its spring assembly is anchored to a metal base 130. Once the module is capped by the pin holder, the complete assembly is sent for a reflow process. As the reflow reaches a temperature above the melting point of the braze material (AuSn), the braze material softens and ultimately melts. The pins are thermally removed from the module in order to avoid unnecessary tears, which ultimately could cause mechanical failures, particularly, when the surface of the module is mechanically polished. The loaded spring 120 is activated, allowing the pin holder to push the pins away from the module with minimum expenditure of force (FIG. 2d). The pins then are automatically collected in a hopper 150.

With the pins removed, the surface of the module is mechanically polished to remove residues of braze material, and of Ni from the top of the Mo. A major concern during polishing is the metallic bridging/smearing debris created by the polish process which may affect the integrity of the TSM (Top Surface Metallurgy). As previously explained, existing techniques had to be discarded due to the fragility of the TSM.

Referring now to FIGS. 3a–3e, several steps preferably used for polishing the bottom surface of the module will now be described.

FIG. 3a illustrates a typical BSM metallurgy, immediately after the pin has been removed. In the first step, the surface of the module is subjected to coarse polishing to remove weak structures within the BSM metallurgy as, for instance, the Ni—Mo layer or loose Mo-ceramic debris 200. This polishing operation accompanied by physical scraping across the surface is very effective in removing all types of loose material, as well as the defective interfaces. This process is best done manually, although it could be automated without much effort. In the manual mode, an operator places the module in a fixture with the BSM facing upward. Medium to high pressure is applied preferably using a polishing rod, in a back and forth motion. The module is rotated in eight directions (i.e., in 45° increments) during polishing for a uniform polishing. A substantial amount of metal bridging/smear debris occurs as a result of using a coarse rod (preferably, having a grit size in the range of 100 degrees). Soaking and rinsing the surface in a 5% micro-cleaner solution (such as Microclean, manufactured by International products Corp., Burlington, New Jersey) was found to be effective in reducing the amount of debris.

Shown in FIG. 3b is a schematic diagram of the bottom surface after completing the coarse polish operation, which is performed with a low grade polish rod that quickly removes the braze. At the end of this first step, most pads are bridged with smeared braze.

The surface is then fine polished (FIG. 3c), preferably with 220 grit wet/dry sanding paper, following the same procedure previously described for coarse polishing. The purpose of the fine polishing is to break down the smear/bridging debris 220 to fine particles, which are more prone for easy removal. This process is, likewise, also followed by using a 5% micro-cleaner solution to remove the loose material.

The fine polish step is followed by yet another fine sanding operation, this time with a 320 degree sanding material (FIG. 3d), and which serves a dual purpose: 1) to reduce the smear material 230 to less than 10 μm. in size, thereby allowing for a better smear/bridging handling, and 2) to permit the formation of a Mo surface having high adhesion to the subsequent Cr—Ni—Au evaporation, which precludes requiring extensive pre-evaporation processing. Again, a 5% micro-cleaner solution is advantageously used to remove loose material.

At this point, the BSM surface is clean and ready for a new set of pads, through Cr—Ni—Au evaporation (FIG. 3e). (Note: the Cr provides adhesion between Mo and the Ni, whereas Au protects the Ni from oxidizing.) Yet, a substantial amount of small metallic particles remain in areas surrounding the edges of the BSM pads. Although these small particles do not bridge the BSM pads under normal conditions, under conditions of reliability stress, i.e., temperature and humidity, these particles may oxidize and form corrosion bridging. An effective way of removing those fine particles is to use a regular pencil eraser, preferably a 112 grade. No detectable contamination on the BSM pads were found after this operation. Finally, the surface is thoroughly cleaned with a 5% micro-cleaning solution and dried to make it ready for the next processing step.

By this stage, all the required polishing and bridging material have been duly removed, leaving the BSM pads clean with the Mo exposed. A new set of BSM I/O pads is then evaporated on the Mo pads, and a new set of pins is brazed over the new pads to form a new module ready for use.

Figure 4A:
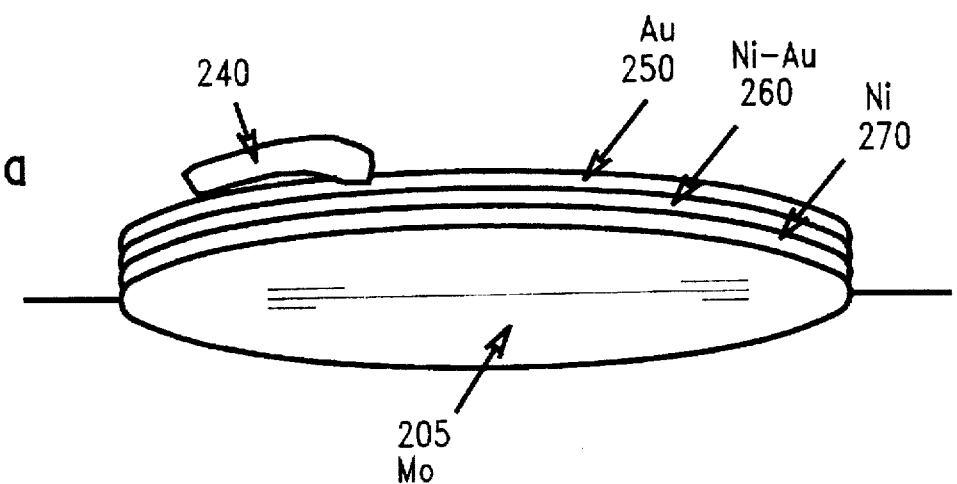
FIGS. 4a–4c show the sequence of steps for removing stains and for replacing the gold removed during polishing.
Figure 4B:
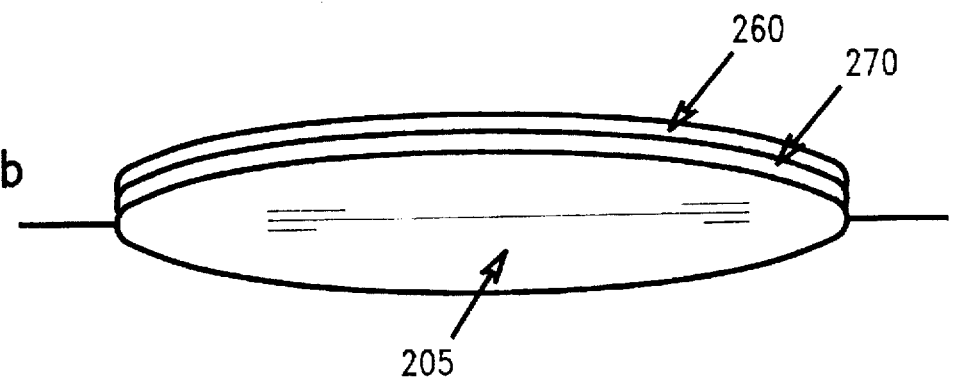
Figure 4C:
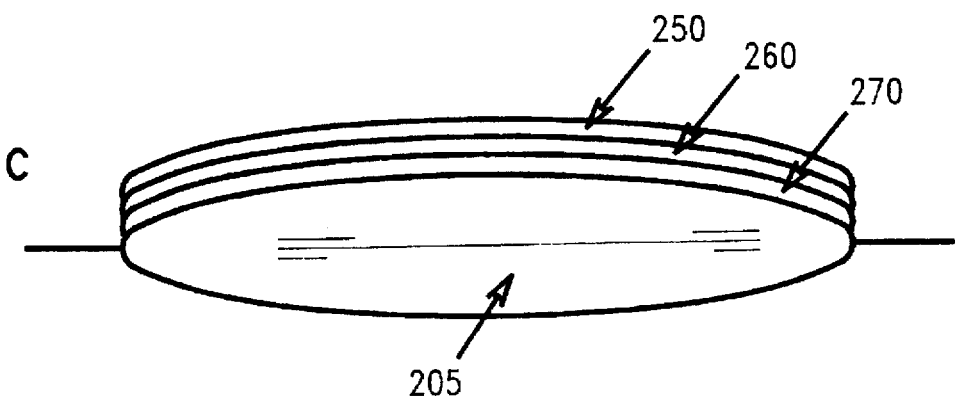

In a last step, illustrated with reference to FIG. 4, both the TSM and BSM are treated to keep the module contamination free, particularly, since during the building or rebuilding of the module, the TSM and BSM surfaces inevitably are prone to contamination by handling and mis-processing. These contaminants have the effect of leaving stains 240 (FIG. 4a) on the metallurgy which essentially prevent proper joining of the chips to the substrate and/or to the I/O pin braze. Oftentimes, this staining may not be realized immediately, but may become a long term reliability concern. The aforementioned polishing steps and, more particularly, the erasing procedure have proven to be effective in removing stains from the TSM and BSM. However, note should be made that, although Ni and/or Ni—Au are not affected by the polishing (layers 260 and 270, FIG. 4b), some of the Au, particularly the top layer 250 (FIG. 4a), is removed during this operation, leading to a lower wettability. As a result, the step of erasing is preferably not used for Au surface cleaning of many product. In such an instance, it has been found that Au could be replenished by a standard immersion Au process to form a new layer 250 (FIG. 4c), wherein the normal immersion of Au on Ni, and a 550° C. diffusion reflow will ensure good wettability. For TSM/BSM erasing and Au replenishing, a low temperature of the order of 350° C. for a duration of 5 minutes has been advantageously employed. This low temperature reflow is critical for a module with pins because a reflow temperature over 400° C. normally results in pin braze failures and damage to the TSM.

Summarizing, the erase cleaning process consists of:
1) TSM/BSM erase clean;
2) TSM/BSM immersion Au replenish; and
3) Immersion Au and Ni low temperature diffusion.

While the invention has been particularly shown and described with reference to a preferred embodiment thereof, it will be understood by those skilled in the art that various changes in form and details may be made therein without departing from the spirit and scope of the invention.

What is claimed is:

1. A method for reworking a defective multi-chip module or substrate provided with a pin array, said pins being attached to pads by a braze material, said pads being positioned on a surface of said module or substrate, said method comprising the steps of:
   a) applying a shearing force against said pins, with said module exposed to a temperature at or above that which is necessary for softening said braze material, to remove said pins;
   b) polishing said surface of said module including said pads;
   c) evaporating new pads; and
   d) attaching new pins to said pads.

2. The method as recited in step b) of claim 1, further comprising the steps of:
   coarse polishing said surface followed by cleaning said surface with a micro-cleaner solution;
   fine polishing said surface and cleaning said surface with a micro-cleaner solution; and
   erasing said surface and cleaning said surface with a micro-cleaner solution.

3. The method as recited in claim 1, wherein said pads are made of Ni or alloys thereof.

4. The method as recited in claim 1, wherein said step of polishing said surface further comprises erasing said surface to remove bridging material from said surface.

5. The method as recited in claim 1, wherein said pads are mask evaporated with a material selected from the group consisting of Cr, Ni, Au, and alloys thereof.

6. The method as recited in claim 1, wherein said pads are evaporated on top of a base contacting a conducting via that brings an interconnecting line to said surface of said module.

7. The method as recited in claim 6, wherein said base is made of Mo.

8. The method as recited in claim 1, wherein said pin is attached to said pad by braze material.

9. The method as recited in claim 8, wherein said braze material is AuSn.

10. The method as recited in claim 1, wherein said polishing is mechanical.

11. The method as recited in claim 10, wherein said mechanical polishing comprises coarse polishing and fine polishing said surface.

12. The method as recited in claim 1, wherein said pins are swept off said surface of said module by a device capturing all said pins.

13. The method as recited in claim 12, wherein said device comprises a spring loaded pin holder, wherein said spring exerts a shearing force against said pins.

14. The method as recited in claim 12, wherein said thermal removal of said pins further comprises the step of heating said module and said device in a furnace, while maintaining said pins captured by said device.

15. A method for re-working a defective multi-chip module or substrate provided with a pin grid array, said pins being attached to BSM pads by a brazing material, said BSM pads being positioned on a thin-film layer deposited on a surface of said module or substrate, said method comprising the steps of:
   capturing said pins forming said pin grid array with a spring loaded device to exert a shearing force on said pins;
   heating said module to soften said braze material;
   exerting said shearing force against said pins, sweeping said pins away from said surface of said module, while maintaining said brazing material in a soft state;
   polishing said surface of said module;
   evaporating new BSM pads on said polished surface at each location where one of said removed pins was previously positioned; and
   attaching new pins to said new BSM pads.

16. The method as recited in claim 15, wherein said base is made of Mo.

17. The method as recited in claim 15, wherein said thermal removal of said pins further comprises the step of heating said module in a furnace with said pins captured by said spring loaded device.

18. The method as recited in claim 15, wherein said new pins are attached to said BSM pads by brazing.

19. The method as recited in claim 15, wherein said BSM pads are mask evaporated on said locations with a material selected from the group consisting of Cr, Ni, Au, and alloys thereof.

20. The method as recited in claim 15, wherein said polishing is mechanical.

21. The method as recited in claim 15, wherein said BSM pads are evaporated on top of a base contacting a conducting via that connects an interconnecting line to said surface of said module.

22. The method as recited in claim 21, wherein said polishing is extended to said base.

* * * * *